US009853605B2

(12) United States Patent
Shiikuma

(10) Patent No.: US 9,853,605 B2
(45) Date of Patent: Dec. 26, 2017

(54) TRANSISTOR PACKAGE, AMPLIFICATION CIRCUIT INCLUDING THE SAME, AND METHOD OF FORMING TRANSISTOR

(71) Applicant: NEC Corporation, Tokyo (JP)

(72) Inventor: Kazumi Shiikuma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/112,912

(22) PCT Filed: Oct. 10, 2014

(86) PCT No.: PCT/JP2014/005161
§ 371 (c)(1),
(2) Date: Jul. 20, 2016

(87) PCT Pub. No.: WO2015/114698
PCT Pub. Date: Aug. 6, 2015

(65) Prior Publication Data
US 2016/0344349 A1    Nov. 24, 2016

(30) Foreign Application Priority Data

Jan. 31, 2014  (JP) ................................. 2014-017171

(51) Int. Cl.
*H03F 1/02*     (2006.01)
*H03F 3/195*   (2006.01)
(Continued)

(52) U.S. Cl.
CPC ..... *H03F 1/0288* (2013.01); *H01L 29/42376* (2013.01); *H03F 3/195* (2013.01);
(Continued)

(58) Field of Classification Search
CPC ................................. H03F 1/0288; H03F 1/07
(Continued)

(56) References Cited

U.S. PATENT DOCUMENTS 5,548,246 A * 8/1996 Yamamoto ............ H03F 1/0277
330/277
5,886,372 A    3/1999 Kai et al.
(Continued)

FOREIGN PATENT DOCUMENTS

JP     H06-237123 A    8/1994
JP     H10-22300 A     1/1998
(Continued)

OTHER PUBLICATIONS

International Search Report corresponding to PCT/JP2014/005161, 2 pages, dated Jan. 13, 2015.
(Continued)

*Primary Examiner* — Henry Choe
(74) *Attorney, Agent, or Firm* — Wilmer Cutler Pickering Hale and Dorr LLP

(57) ABSTRACT

A transistor package according to one exemplary embodiment includes main transistors and a sub-transistor placed in the same package as the main transistors and having a smaller size than the main transistors. It is thereby possible to provide a transistor package with more versatility capable of forming various types of Doherty amplification circuits such as a Doherty amplification circuit with auto-biasing function and an extended Doherty amplification circuit with desired operating characteristics, an amplification circuit including the same, and a method of forming a transistor.

9 Claims, 18 Drawing Sheets

(51) Int. Cl.
  *H03F 3/24* (2006.01)
  *H01L 29/423* (2006.01)
  *H03F 3/21* (2006.01)

(52) U.S. Cl.
  CPC .............. *H03F 3/21* (2013.01); *H03F 3/245* (2013.01); *H03F 2200/18* (2013.01); *H03F 2200/471* (2013.01)

(58) Field of Classification Search
  USPC .............................................. 330/295, 124 R
  See application file for complete search history.

(56) References Cited

U.S. PATENT DOCUMENTS

| | | | |
|---|---|---|---|
| 6,044,255 A | 3/2000 | Suematsu et al. | |
| 7,560,983 B1 * | 7/2009 | Luschas | H03F 1/0277 330/124 R |
| 8,610,503 B2 * | 12/2013 | Kaczman | H03F 1/083 330/124 R |
| 9,369,092 B2 * | 6/2016 | Zeng | H03F 1/3223 |
| 2005/0083129 A1 | 4/2005 | Tsurumaki et al. | |
| 2008/0068086 A1 | 3/2008 | Tsurumaki et al. | |
| 2009/0072906 A1 | 3/2009 | Tsurumaki et al. | |
| 2010/0045385 A1 | 2/2010 | Pengelly | |
| 2015/0048887 A1 * | 2/2015 | Nitta | H03F 1/22 330/279 |

FOREIGN PATENT DOCUMENTS

| | | |
|---|---|---|
| JP | H10-270953 A | 10/1998 |
| JP | 2002-075802 A | 3/2002 |
| JP | 2005-123861 A | 5/2005 |
| JP | 2011-182043 A | 9/2011 |
| JP | 2012-500583 | 1/2012 |
| WO | WO-2005/029695 A1 | 3/2005 |
| WO | WO-2010/021957 | 2/2010 |

OTHER PUBLICATIONS

Freescale Semiconductor, Technical Data, RF Power LDMOS Transistors, N-Channel Enhancement-Mode Lateral MOSFETs, Document No. AFT09H310-03S, Sep. 2013, [online] [Searched on Dec. 17, 2013], Internet <URL:http://www.freescale.com/files/rf_if/doc/data_sheet/AFT09H310-03S.pdf>, 18 pages.

Japanese Office Action issued by the Japan Patent Office for Japanese Application No. 2015-559622 dated Aug. 25, 2017 (11 pages).

* cited by examiner

|     | APPLICATION EXAMPLE 1 | APPLICATION EXAMPLE 2 | APPLICATION EXAMPLE 3 |
|-----|-----------------------|-----------------------|-----------------------|
| MT1 | CARRIER               | CARRIER               | CARRIER               |
| ST1 | EXTENDED              | CARRIER               | BIAS                  |
| MT2 | PEAK                  | PEAK                  | PEAK                  |
| ST2 | BIAS                  | PEAK                  | PEAK                  |

Fig. 16

|  | APPLICATION EXAMPLE 1 | APPLICATION EXAMPLE 2 | APPLICATION EXAMPLE 3 | APPLICATION EXAMPLE 4 |
|---|---|---|---|---|
| MT1 | CARRIER | CARRIER | CARRIER | PEAK |
| ST1 | CARRIER | BIAS | PEAK | CARRIER |
| ST2 | PEAK | PEAK | PEAK | CARRIER |
| MT2 | PEAK | PEAK | PEAK | CARRIER |

Fig. 18

TRANSISTOR PACKAGE, AMPLIFICATION CIRCUIT INCLUDING THE SAME, AND METHOD OF FORMING TRANSISTOR

CROSS-REFERENCE TO RELATED APPLICATIONS

This application is a national stage application of International Application No. PCT/JP2014/005161 entitled "TRANSISTOR PACKAGE, AMPLIFICATION CIRCUIT INCLUDING THE SAME, AND METHOD OF FORMING TRANSISTOR," filed on October 10, 2014, which claims the benefit of the priority of Japanese Patent Application No. 2014-017171 filed on January 31, 2014, the disclosures of each of which are hereby incorporated by reference in their entirety.

TECHNICAL FIELD

The present invention relates to a transistor package, an amplification circuit including the same, and a method of forming a transistor.

BACKGROUND ART

High linearity and high efficiency are required for power amplification circuits used in wireless communication systems. Particularly, recent multivalued digital modulation communication systems or the like often process a signal whose average amplitude and maximum amplitude are largely different. When amplifying such a signal using an existing power amplification circuit, the operating point of this power amplification circuit is set to amplify the signal to the maximum amplitude without distortion. Therefore, there is only a little time for the circuit to operate at near the saturation output power where relatively high efficiency can be maintained, and the efficiency of the power amplification circuit is low in general.

A solution to the above problem is disclosed in Patent Literature 1. Patent Literature 1 discloses the configuration of a Doherty amplification circuit that improves the power efficiency while maintaining the linearity. The Doherty amplification circuit includes a splitter that splits an input signal, a carrier amplifier that linearly amplifies one split signal, a peak amplifier that non-linearly amplifies the other split signal, and a combiner that combines output signals of the carrier amplifier and the peak amplifier. This Doherty amplification circuit thereby achieves high efficiency while maintaining the linearity. Further, this Doherty amplification circuit achieves downsizing by forming the carrier amplifier and the peak amplifier by transistors in one package.

Recently, Doherty amplification circuits with various operating characteristics like symmetrical type to extended type have been used as power amplification circuits. Thus, it is demanded to enhance the efficiency by reducing design man-hours and management and adjustment man-hours when designing and manufacturing such various types of Doherty amplification circuits.

Non Patent Literature 1 discloses an extended Doherty amplification circuit in which the sizes of transistors respectively forming a carrier amplifier and a peak amplifier and the relative position of the carrier amplifier and the peak amplifier are fixed. Patent Literature 2 discloses the configuration of a bias circuit that appropriately absorbs the variation of elements without degrading the high frequency characteristics.

CITATION LIST

Patent Literature

PTL1: International Patent Publication No. 2005/029695
PTL2: Japanese Unexamined Patent Application Publication No. H6-237123

Non Patent Literature

NPL1: freescale Semiconductor, Inc., "Technical Data", [online,] [Searched on Dec. 17, 2013], Internet <URL:http://www.freescale.com/files/rf_if/doc/data_sheet/AFT09H310-03S.pdf>

SUMMARY OF INVENTION

Technical Problem

The sizes of the transistors in one package disclosed in Patent Literature 1 would be the same. Therefore, in the case of forming an extended Doherty amplification circuit with desired operating characteristics by using the transistors in the package, for example, the package needs to include a certain number of transistors of the same size, the certain number corresponding to the ratio of electric power that is distributed to each of the carrier amplifier and the peak amplifier, which increases the package size. As a result, the circuit scale of the extended Doherty amplification circuit increases. Further, because the sizes of transistors respectively forming a carrier amplifier and a peak amplifier and the relative position of the carrier amplifier and the peak amplifier are fixed in the extended Doherty amplification circuit disclosed in Non Patent Literature 1 as described above, the amplification placement flexibility is degraded. For example, when forming the extended Doherty amplifier where the positions of the carrier amplifier and the peak amplifier are interchanged, the package of another transistor configuration in which the positions of transistors respectively forming the carrier amplifier and the peak amplifier are interchanged is required, thus having a problem of low design flexibility and low transistor versatility. As described above, in the transistor configurations of the packages disclosed in Patent Literature 1 and Non Patent Literature 1, it is difficult to form various types of Doherty amplification circuits more efficiently. The other problems and novel features of the present invention will become apparent from the description of the specification and the accompanying drawings.

The present invention has been accomplished to solve the above problems and an exemplary object of the present invention is thus to provide a transistor package with more versatility capable of efficiently forming various types of Doherty amplification circuits such as a Doherty amplification circuit with auto-biasing function and an extended Doherty amplification circuit with desired operating characteristics, an amplification circuit including the same, and a method of forming a transistor.

Solution to Problem

According to one exemplary aspect of the present invention, a transistor package includes first and second main transistors, and a first sub-transistor placed in the same package as the first and second main transistors and having a smaller size than the first and second main transistors.

Further, according to one exemplary aspect of the present invention, a method of forming a transistor includes forming first and second main transistors and a first sub-transistor having a smaller size than the first and second main transistors in one package.

Advantageous Effects of Invention

According to one exemplary aspect of the present invention described above, it is possible to provide a transistor package with more versatility capable of forming various types of Doherty amplification circuits, an amplification circuit including the same, and a method of forming a transistor.

BRIEF DESCRIPTION OF DRAWINGS

FIG. 16 is a view illustrating a Doherty amplification circuit to which the transistor package PKG2 shown in FIG. 15 is applied.

FIG. 18 is a view illustrating a Doherty amplification circuit to which the transistor package PKG3 shown in FIG. 17 is applied.

DESCRIPTION OF EMBODIMENTS

Exemplary embodiments of the present invention are described hereinafter with reference to the drawings. It should be noted that the drawings are given in simplified form by way of illustration only, and thus are not to be considered as limiting the present invention. The same elements are denoted by the same reference symbols, and the redundant explanation is omitted.

In the following exemplary embodiments, the description will be split into a plurality of sections or embodiments when necessary for the sake of convenience. However, unless explicitly specified otherwise, those sections or embodiments are by no means unrelated to each other, but are in such a relation that one represents a modification, a detailed or supplementary description, etc. of part or whole of the other. Further, in the following exemplary embodiments, when a reference is made to the number etc, (including the number, numeric value, quantity, range, etc.) of elements, except in such cases where it is explicitly specified otherwise or the number is obviously limited to a specific number in principle, the number is not limited to the specific number but may be greater or less than the specific number.

It is needless to mention that, in the following exemplary embodiments, their constituent elements (including operation steps) are not necessarily essential, except in such cases where it is explicitly specified otherwise or they are obviously considered to be essential in principle. Likewise, in the following exemplary embodiments, when a reference is made to the shape, relative position, etc. of a constituent element or the like, this includes those shapes etc. substantially resembling or similar to that shape etc., except in such cases where it is explicitly specified otherwise or it is obviously considered otherwise in principle. The same applies to the number etc, (including the number, numeric value, quantity, range, etc.) mentioned above.

<First Exemplary Embodiment>

Figure 1:
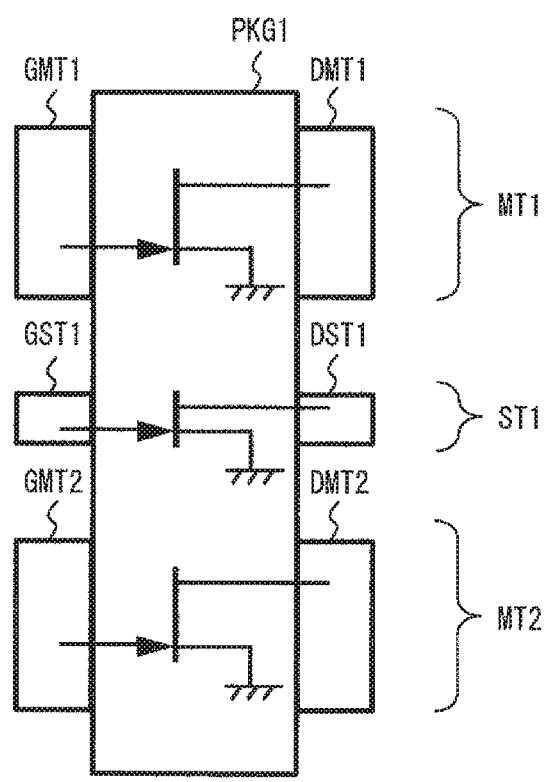
FIG. 1 is a plan view showing the overview of a transistor package PKG1 according to a first exemplary embodiment.

FIG. 1 is a plan view showing the overview of a transistor package PKG1 according to a first exemplary embodiment. The transistor package PKG1 shown in FIG. 1 is a transistor package including a plurality of transistors for forming a Doherty amplification circuit or the like, and it includes a main transistor (first main transistor) MT1, a main transistor (second main transistor) MT2, and a sub-transistor (first sub-transistor) ST1. Note that, in this exemplary embodiment, the case where all of the main transistors MT1 and MT2 and the sub-transistor ST1 are N-channel field effect transistors is described as an example.

In the example of FIG. 1, the sub-transistor ST1 is placed at the center of the package, and the main transistors MT1 and MT2 are placed near both ends of the package with the sub-transistor ST1 placed therebetween. Note that the layout of the main transistors MT1 and MT2 and the sub-transistor ST1 is not limited to the one shown in FIG. 1. For example, one of the main transistors MT1 and MT2 may be placed at the center of the package in place of the sub-transistor ST1.

The size of the sub-transistor ST1 is smaller than the size of the main transistors MT1 and MT2. Specifically, the gate width Wa of the sub-transistor ST1 is smaller than the gate width Wb of the main transistors MT1 and MT2. It is suitable that the size of the sub-transistor ST1 is ½ to 1/20 the size of the main transistors MT1 and MT2.

A drain electrode DMT1 and a gate electrode GMT1 of the main transistor MT1, a drain electrode DMT2 and a gate electrode GMT2 of the main transistor MT2, and a drain electrode DST1 and a gate electrode GST1 of the sub-transistor ST1 are formed to project from the transistor package PKG1. Note that the sources of the main transistors MT1 and MT2 and the sub-transistor ST1 are grounded.

In this configuration, the transistor package PKG1 shown in FIG. 1 can form various types of Doherty amplification circuits such as a Doherty amplification circuit with auto-biasing function and an extended Doherty amplification circuit. Because the transistor package PKG1 shown in FIG. 1 has the small size sub-transistor ST1, it is possible to achieve various types of Doherty amplification circuits in a small scale.

Note that the main transistors MT1 and MT2 and the sub-transistor ST1 preferably have substantially the same DC characteristics and the same high frequency characteristics per unit gate width. For example, the main transistors MT1 and MT2 and the sub-transistor ST1 are formed by the same die and therefore have substantially the same DC characteristics and the same high frequency characteristics per unit gate width. It is thereby possible to improve the performance of the Doherty amplification circuit to which the transistor package PKG1 is applied. For example, in the case of a Doherty amplification circuit with auto-biasing function, it is possible to apply a desired bias to each transistor with high accuracy and less variation. Further, in the case of an extended Doherty amplification circuit, it is possible to split and combine power at a desired distribution ratio to the carrier amplifier and the peak amplifier, and more stably obtain the gain and output power that are desirable as the Doherty amplifier. Further, this has an advantage in manufacturing and adjustment cost reduction and size reduction as well. The details of such amplifier circuits are described in a second exemplary embodiment and later.

There may be a case where the transistor package PKG1 includes a transistor input and output matching circuit or the like, though not shown in the example of FIG. 1. The description of such a case, however, is omitted because the essence of the present invention does not change, and it is not a necessary element.

<Second Exemplary Embodiment>

In this exemplary embodiment, a Doherty amplification circuit with auto-biasing function is described as one example of a Doherty amplification circuit to which the transistor package PKG1 shown in FIG. 1 is applied.

Figure 2:
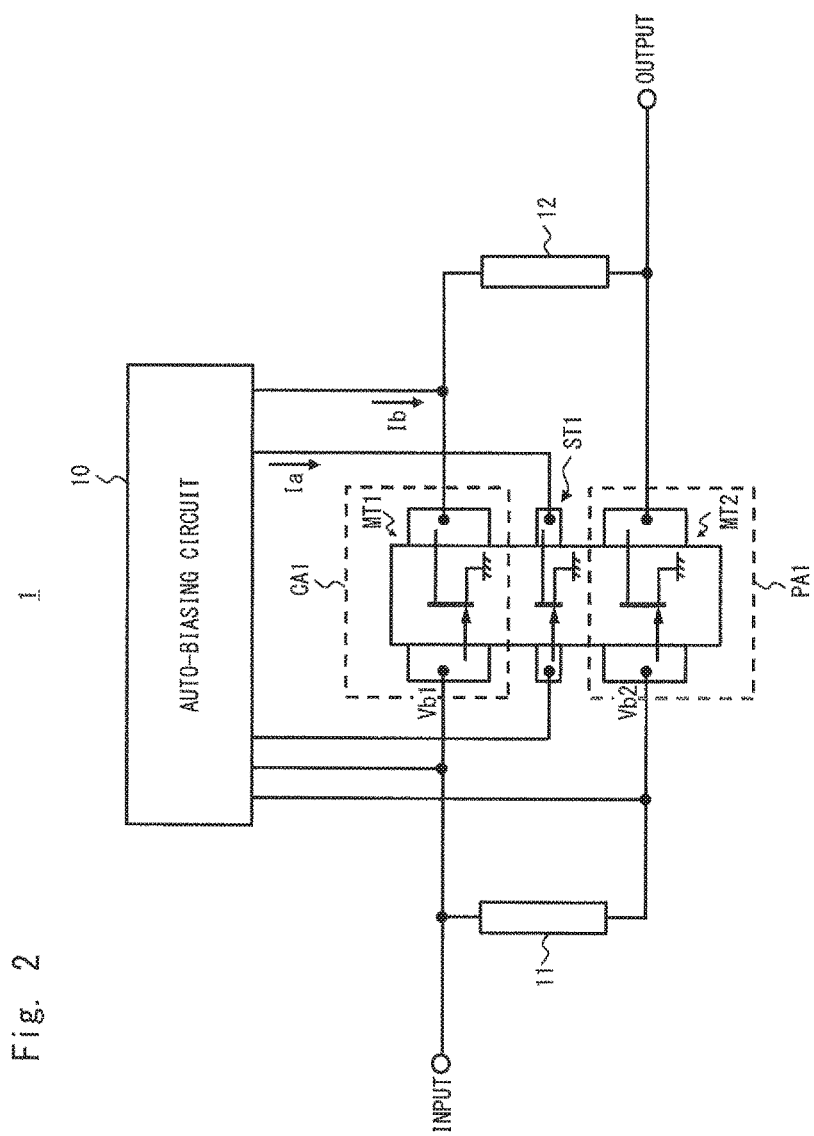
FIG. 2 is a view showing a configuration example of a Doherty amplification circuit according to a second exemplary embodiment.

FIG. 2 is a view showing a configuration example of a Doherty amplification circuit 1 according to a second exemplary embodiment. The Doherty amplification circuit 1 shown in FIG. 2 includes a carrier amplifier (first amplifier) CA1, a peak amplifier (second amplifier) PA1, an auto-biasing circuit 10, a splitter 11 and a combiner 12. Note that, for simplification, a matching circuit and a bypass capacitor and the like are omitted in FIG. 2.

(Splitter 11)

The splitter 11 splits an input signal and generates first and second split signals. The splitter 11 generates the first and second split signals by adjusting the phase of the input signal so that the output signals of the carrier amplifier CA1 and the peak amplifier PA1 are in phase when they are combined by the combiner 12. For example, the splitter 11 is composed of a ¼ wavelength transmission line, a 90° hybrid circuit and the like.

(Carrier Amplifier CA1)

The carrier amplifier CA1 is formed by the main transistor MT1 included in the transistor package PKG1, and it amplifies the first split signal input to the gate of the main transistor MT1 and outputs the amplified signal through the drain of the main transistor MT1. The carrier amplifier CA1 is biased with the class AB or B mode, and linearly amplifies the first split signal.

(Peak Amplifier PA1)

The peak amplifier PA1 is formed by the main transistor MT2 included in the transistor package PKG1, and it amplifies the second split signal input to the gate of the main transistor MT2 and outputs the amplified signal through the drain of the main transistor MT2. The peak amplifier PA1 is biased with the class C mode, and non-linearly amplifies the second split signal. Thus, the peak amplifier PA1 performs amplification only during high power output.

(Combiner 12)

The combiner 12 combines the output signals of the carrier amplifier CA1 and the peak amplifier PA1 and outputs it as the output signal of the Doherty amplification circuit 1. For example, the combiner 12 is generally composed of a transformer, an impedance transformer, or a ¼ wavelength transmission line in general when processing a signal of a microwave band or the like.

The Doherty amplification circuit 1 includes the carrier amplifier CA1 that operates near the saturation output power and maintains saturation and the peak amplifier PA1 that operates only near the saturation output power, and thereby achieves higher power efficiency than a general amplification circuit in the class A or AB mode even during output while keeping back-off from the saturation power.

The carrier amplifier CA1 and the peak amplifier PA1 are built in one package. Therefore, it is possible to reduce the size of the Doherty amplification circuit 1 compared with the configuration in which the carrier amplifier CA1 and the peak amplifier PA1 are built in different packages. Further, because a transmission line length from the outputs of the carrier amplifier CA1 and the peak amplifier PA1 to a signal combining point in the combiner 12 is shortened, transmission loss is reduced. As a result, it is possible to enhance the power efficiency of the Doherty amplification circuit 1.

(Auto-Biasing Circuit 10)

The auto-biasing circuit 10 is a circuit that automatically sets a bias current or a bias voltage for each of the carrier amplifier CA1 and the peak amplifier PA1. Note that, in practice, the auto-biasing circuit 10 operates on condition that a DC blocking capacitor is placed in an input and output signal line of each amplifier, though it is not shown in FIG. 2. A specific configuration example of the auto-biasing circuit 10 is described later with reference to FIG. 4 and the like.

First, the auto-biasing circuit 10 detects a gate voltage of the sub-transistor ST1 that maintains a drain current (bias current) of the sub-transistor ST1 at a specified value Ia.

Then, the auto-biasing circuit 10 supplies a bias voltage Vb1 corresponding to the detected gate voltage (in this example, the detected gate voltage is used as it is as the bias voltage Vb1) to the gate of the main transistor MT1. A drain current (bias current) of the main transistor MT1 that constitutes the carrier amplifier CA1 is thereby set to a desired value Ib. For example, the bias voltage Vb1 is set to a bias voltage value with which the carrier amplifier CA1 operates as an amplifier in the class AB or B mode.

When the bias current of the sub-transistor ST1 is Ia, and the bias current of the main transistor MT1 is Ib, the relationship between the bias currents Ia and Ib is represented by $Ia=(Wa/Wb) \times Ib$, for example.

After that, the auto-biasing circuit 10 supplies a bias voltage Vb2 corresponding to the detected gate voltage to the gate of the main transistor MT2. In this example, the auto-biasing circuit 10 subtracts a voltage from the bias voltage Vb1 by using a voltage adder/subtractor 13 and thereby generates the bias voltage Vb2 at a lower voltage level than the bias voltage Vb1. The drain current (bias current) of the main transistor MT2 that forms the peak amplifier PA1 is thereby set to a desired value. For example, the bias voltage Vb2 is set to a bias voltage value with which the peak amplifier PA1 operates as an amplifier in the class C mode.

Figure 3:
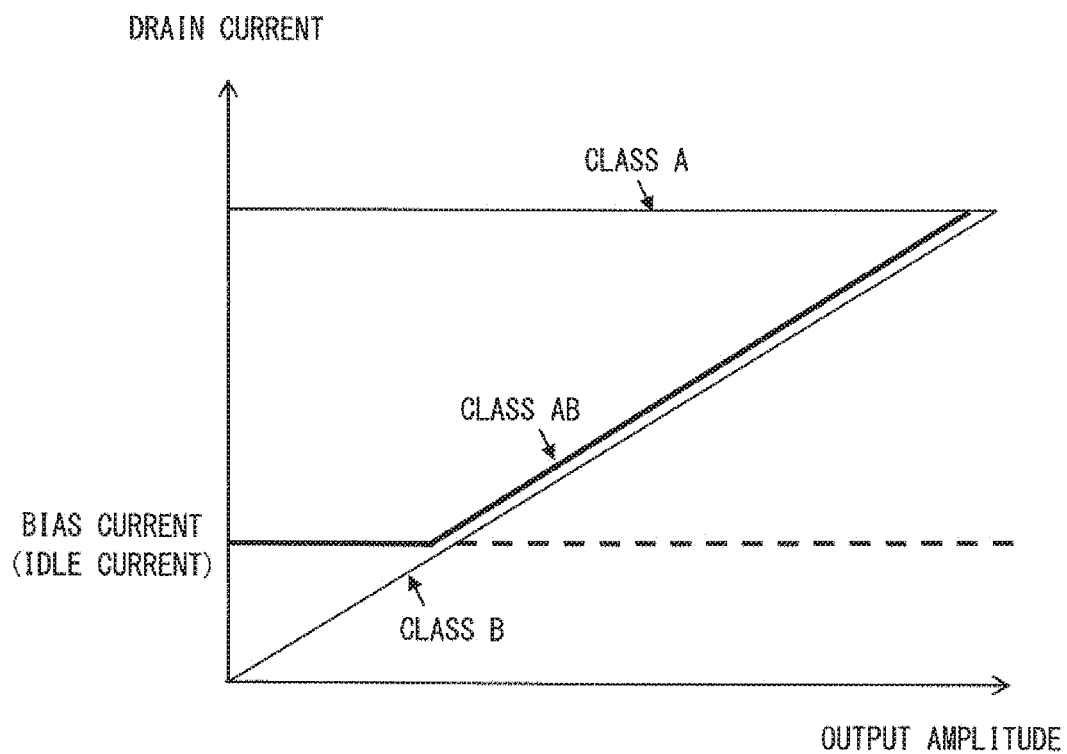
FIG. 3 is a view showing the relationship between the output amplitude and the drain current of an amplification circuit of each class.

FIG. 3 is a view showing the relationship between the output amplitude and the drain current of an amplification circuit of each class. As described earlier, the carrier amplifier CA1 is biased to the class AB mode where the drain current increases with an increase in the output amplitude.

If the auto-biasing circuit 10 has the configuration that directly supplies the bias voltage Vb1 to the gate of the main transistor MT1, the drain current of the carrier amplifier CA1 is maintained at a certain value by given negative feedback function of the auto-biasing circuit 10 even with an increase in the output amplitude (see the dotted line of FIG. 3). Thus, the carrier amplifier CA1 cannot perform desired amplification. Further, a current detector such as a resistor is generally placed between a power supply and the drain of the carrier amplifier CA1 for detection of a drain current. The current detector causes an increase in power consumption.

In view of the above, the auto-biasing circuit 10 according to this exemplary embodiment detects and sets the bias voltage Vb1 (Vb2) by using the sub-transistor ST1. Because there is no signal input and output to the sub-transistor ST1, the bias voltage Vb1 does not change due to signal input and output. Thus, the bias voltage Vb1 of the carrier amplifier CA1 is maintained at a desired value by the auto-biasing circuit 10 regardless of signal input and output. Accordingly, the drain current of the carrier amplifier CA1 is not maintained at a certain value even with an increase in the output amplitude (see the solid line in FIG. 3). The carrier amplifier CA1 can thereby perform desired amplification. Further, because the size of the sub-transistor ST1 is small, even when a current detector such as a resistor is placed between a power supply and the drain of the sub-transistor ST1, it is possible to reduce the power consumed by the current detector.

As described above, it is possible to form the Doherty amplification circuit with auto-biasing function by using the transistor package PKG1. Because the transistor package PKG1 has the small size sub-transistor ST1, it is possible to achieve the Doherty amplification circuit with auto-biasing function in a small scale.

Further, because a transmission line length from the outputs of the carrier amplifier CA1 and the peak amplifier PA1 to a signal combining point is shortened, transmission loss is reduced. As a result, it is possible to enhance the power efficiency of the Doherty amplification circuit 1.

Note that the gate voltage of the sub-transistor ST1 may be used for bias setting of a driver or a pre-driver with very small output power in the previous stage of the Doherty amplification circuit 1, for example. "Very small" indicates a region in which the drain current is regarded as substantially constant regardless of output power near the operating point. Because a part of power consumed by the auto-biasing circuit 10 can be used for bias setting of a driver or a pre-driver, it is possible to further enhance the power efficiency of the whole amplification circuit. As a matter of course, the driver or the pre-driver may have the configuration of the Doherty amplification circuit with auto-biasing function as shown in FIG. 2, for example.

Further, the configuration of the auto-biasing circuit 10 shown in FIG. 2 is just one example for illustrating the principle of operation of the present invention, and it may be changed into another configuration having equal functions. Several specific examples are described below.

(First Specific Configuration Example of Doherty Amplification Circuit 1)

Figure 4:
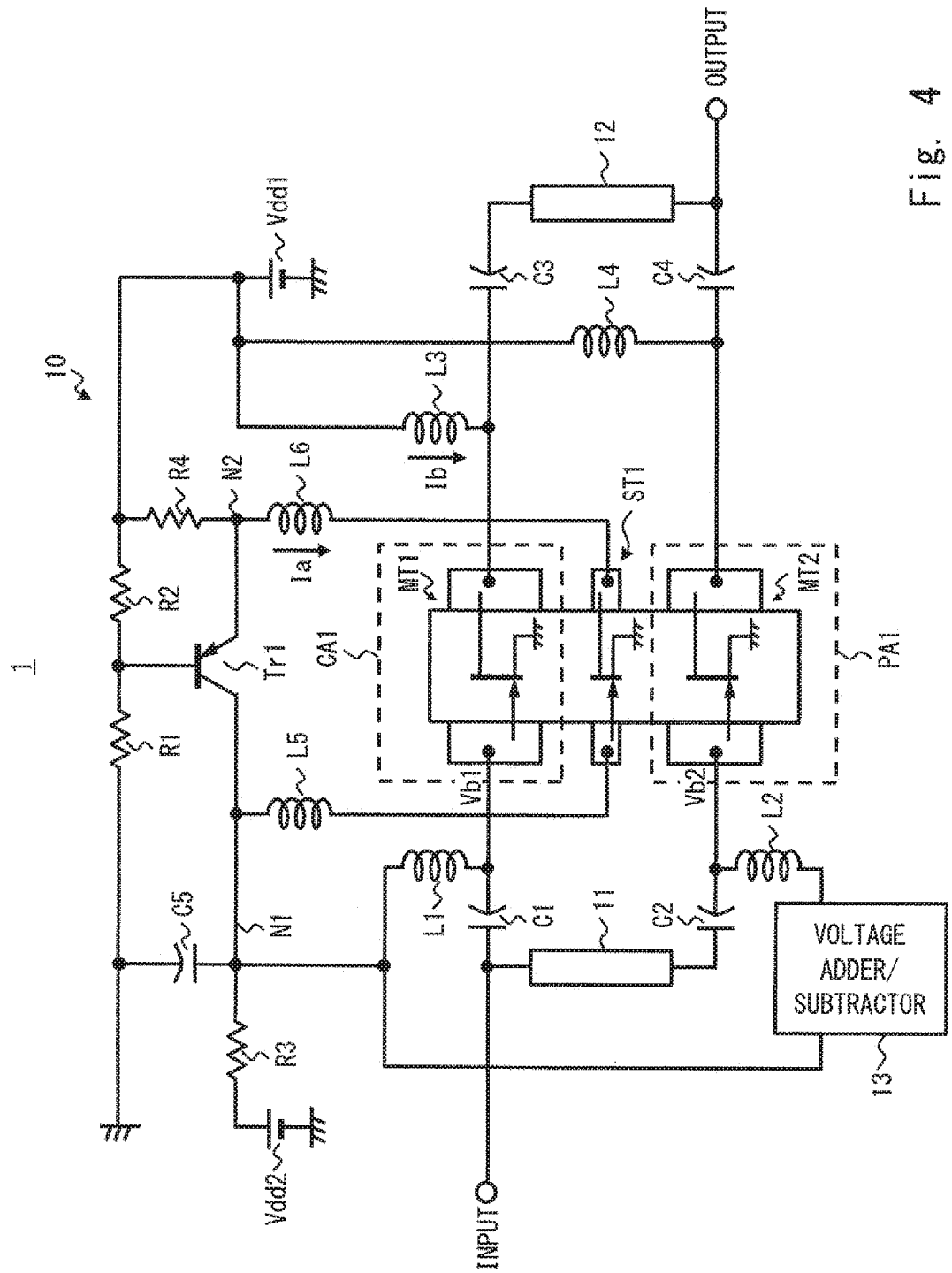
FIG. 4 is a view showing a first specific configuration example of the Doherty amplification circuit according to the second exemplary embodiment.

FIG. 4 is a view showing a first specific configuration example of the Doherty amplification circuit 1. FIG. 4 shows a first specific configuration example of the auto-biasing circuit 1.

The auto-biasing circuit 10 shown in FIG. 4 includes capacitors C1 to C5, coils L1 to L6, resistors R1 to R4, a voltage adder/subtractor 13, a bipolar transistor Tt1, and a sub-transistor ST1 included in the transistor package PKG1. The coils L1 to L6 are RF choke coils in this example.

The resistors R1 and R2 are connected in series between a ground voltage terminal GND and a power supply voltage terminal Vdd1. In the bipolar transistor Tt1, the base is connected to a node between the resistors R1 and R2, the collector is connected to a node N1, and the emitter is connected to a node N2. The resistor R3 is placed between a power supply voltage terminal Vdd2 and the node N1. The resistor R4 is placed between the power supply voltage terminal Vdd1 and the node N2.

The capacitor C1 is placed between a node between the external input terminal of the Doherty amplification circuit 1 and the input terminal of the splitter 11 and the input terminal of the carrier amplifier CA1 (the gate electrode of the transistor MT1). The capacitor C2 is placed between the output terminal of the splitter 11 and the input terminal of the peak amplifier PA1 (the gate electrode of the transistor MT2). The capacitor C3 is placed between the output terminal of the carrier amplifier CA1 (the drain electrode of the transistor MT1) and the input terminal of the combiner 12. The capacitor C4 is placed between the output terminal of the peak amplifier PA1 (the drain electrode of the transistor MT2) and a node between the external output terminal of the Doherty amplification circuit 1 and the output terminal of the combiner 12. The capacitor C5 is placed between the ground voltage terminal GND and the node N1.

The coil L1 is placed between the input terminal of the carrier amplifier CA1 and the node N1. The coil L2 is placed between the input terminal of the peak amplifier PA1 and the node N1. The coil L3 is placed between the output terminal of the carrier amplifier CA1 and the power supply voltage terminal Vdd1. The coil L4 is placed between the output terminal of the peak amplifier PA1 and the power supply voltage terminal Vdd1. The coil L5 is placed between the gate electrode of the sub-transistor ST1 and the node N1. The coil L6 is placed between the drain electrode of the sub-transistor ST1 and the node N2. The voltage adder/subtractor 13 is placed between the coil L2 and the node N1.

Note that, for avoiding unwanted oscillation, it is preferred that the input and output of the sub-transistor ST1 are appropriately terminated. Further, if the placement or application of the circuit is determined, the gate bias may be applied by RF choke in the package.

(Second Specific Configuration Example of Doherty Amplification Circuit 1)

Figure 5:
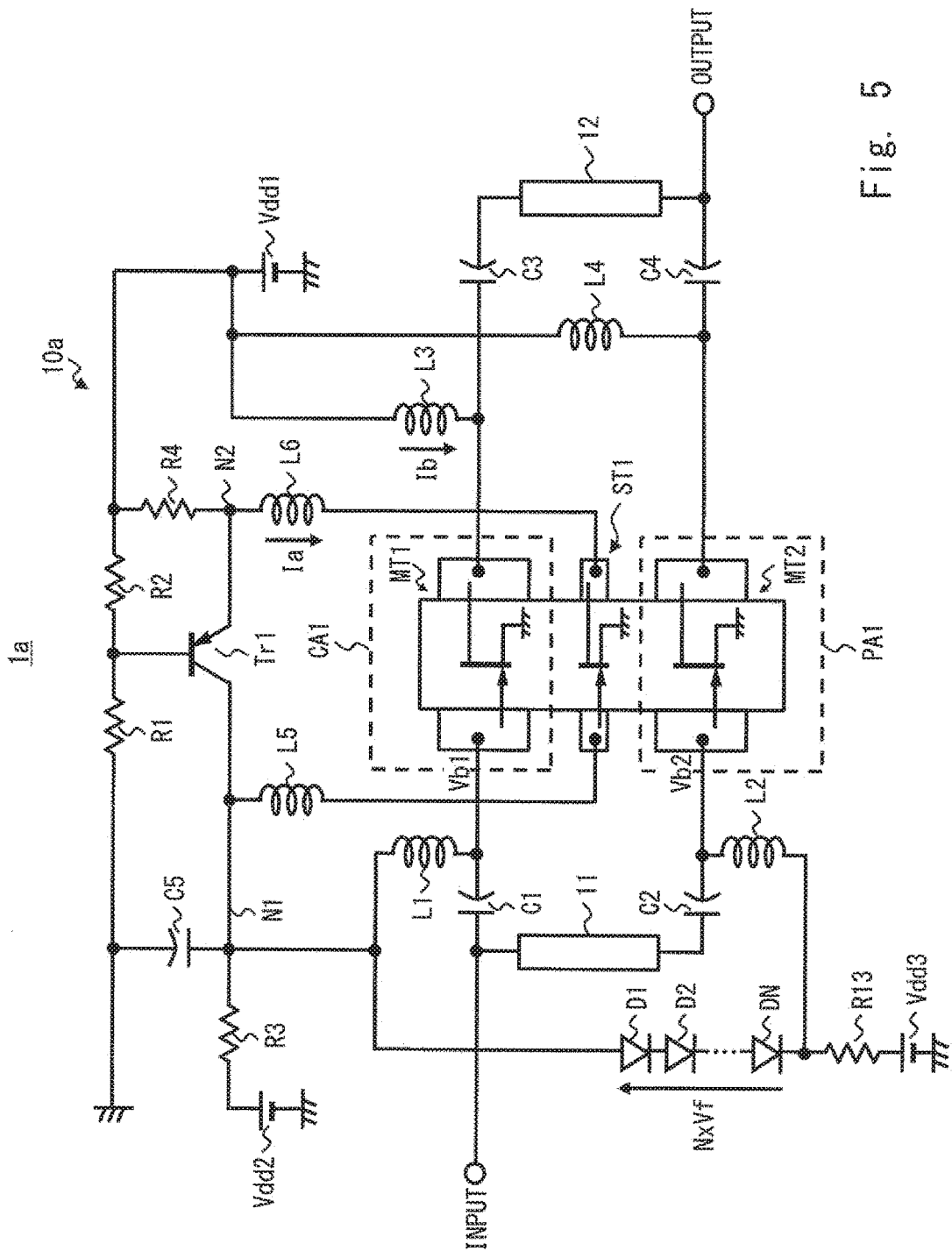
FIG. 5 is a view showing a second specific configuration example of the Doherty amplification circuit according to the second exemplary embodiment.

FIG. 5 is a view showing a second specific configuration example of the Doherty amplification circuit 1 as a Doherty amplification circuit 1a. The Doherty amplification circuit 1a shown in FIG. 5 is different from the Doherty amplification circuit 1 shown in FIG. 4 in that it includes N (N is a natural number) number of diodes D1 to DN and a resistor R13 as the voltage adder/subtractor 13.

The diodes D1 to DN are connected in series between the node N1 and the coil L2. Note that the anodes of the diodes D1 to DN are connected to the node N1 side, and the cathodes of the diodes D1 to DN are connected to the coil L2 side. The resistor R13 is placed between a node between the diodes D1 to DN and the coil L2 and a power supply voltage terminal Vdd3.

When a voltage drop per diode is Vf, the relationship of the bias voltages Vb1 and Vb2 is represented by Vb2=Vb1−N×Vf. Because a voltage drop per diode is about 0.7V, when there are three diodes, for example, a potential difference between the bias voltages Vb1 and Vb2 is about 2.1V. Note that diodes with different degrees of voltage drop may be used in combination.

(Third Specific Configuration Example of Doherty Amplification Circuit 1)

Figure 6:
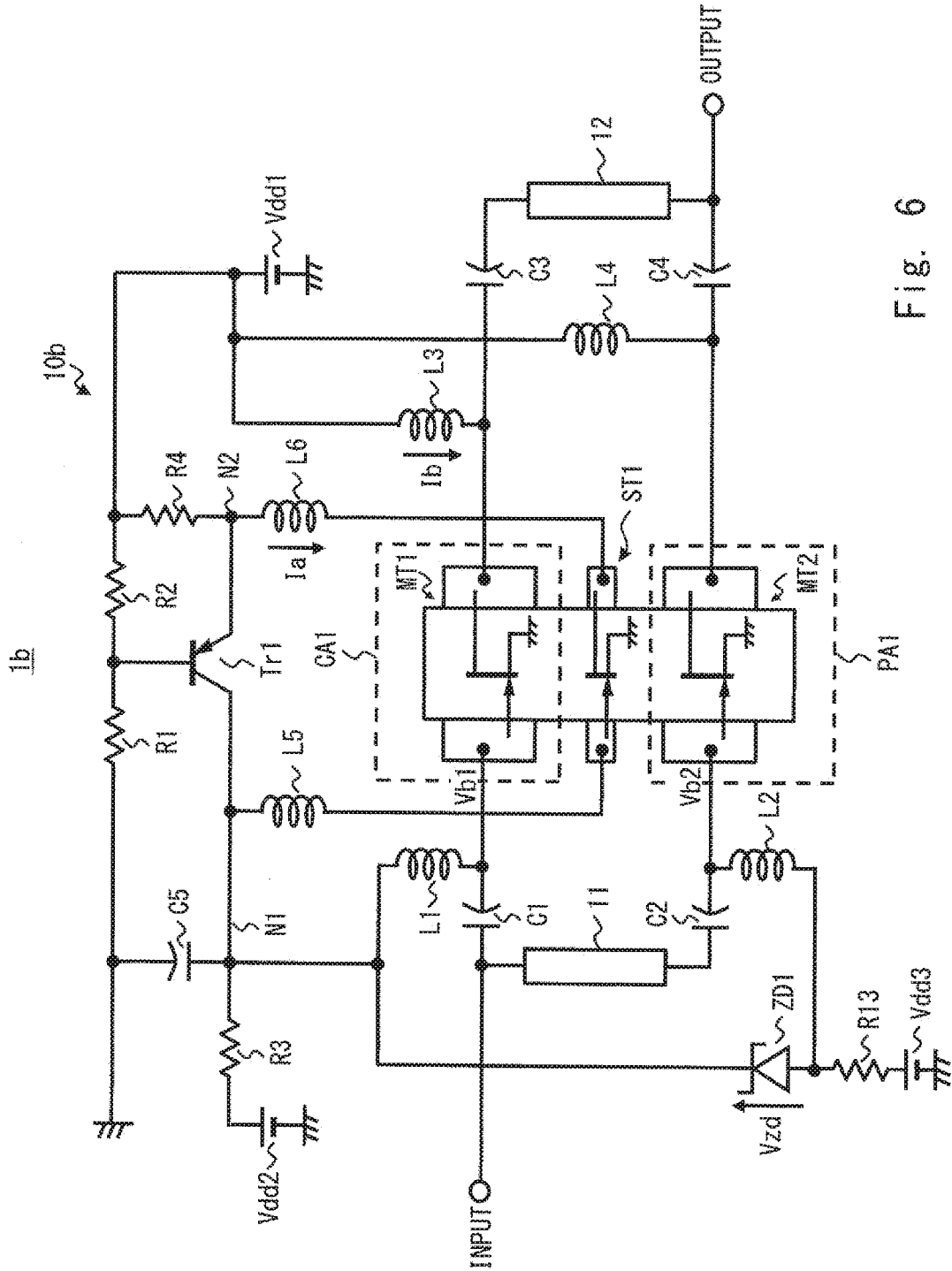
FIG. 6 is a view showing a third specific configuration example of the Doherty amplification circuit according to the second exemplary embodiment.

FIG. 6 is a view showing a third specific configuration example of the Doherty amplification circuit 1 as a Doherty amplification circuit 1b. The Doherty amplification circuit 1b shown in FIG. 6 is different from the Doherty amplification circuit 1 shown in FIG. 4 in that it includes a Zener diode ZD1 and a resistor R13 as the voltage adder/subtractor 13.

The cathode of the Zener diode ZD1 is connected to the node N1, and the anode of the Zener diode ZD1 is connected to the coil L2. The resistor R13 is placed between a node between the Zener diode ZD1 and the coil L2 and the power supply voltage terminal Vdd3.

When a breakdown voltage of the Zener diode ZD1 is Vzd, the relationship of the bias voltages Vb1 and Vb2 is represented by Vb2=Vb1−Vzd.

(Fourth Specific Configuration Example of Doherty Amplification Circuit 1)

Figure 7:
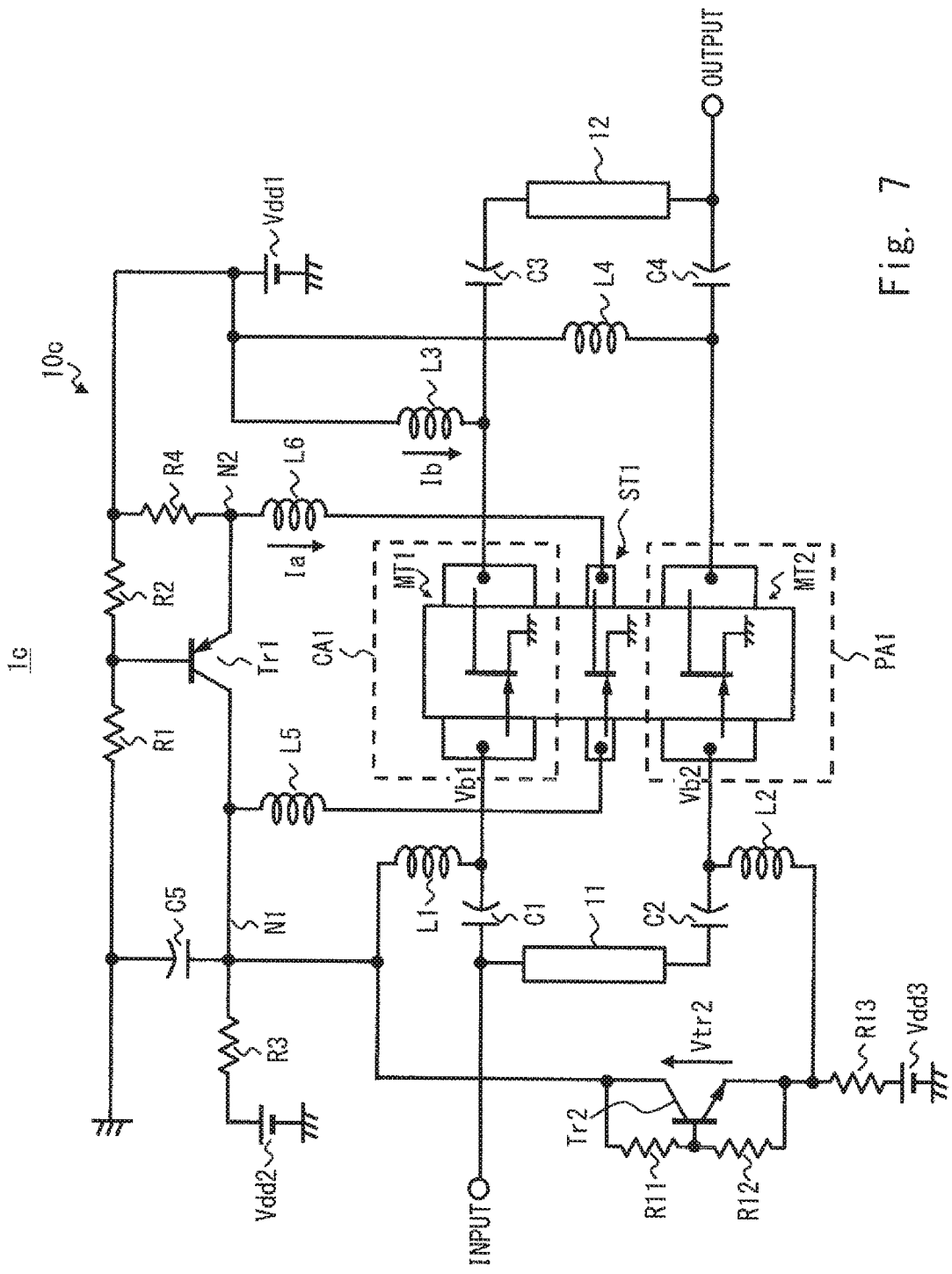
FIG. 7 is a view showing a fourth specific configuration example of the Doherty amplification circuit according to the second exemplary embodiment.

FIG. 7 is a view showing a fourth specific configuration example of the Doherty amplification circuit 1 as a Doherty amplification circuit 1c. The Doherty amplification circuit 1c shown in FIG. 7 is different from the Doherty amplification circuit 1 shown in FIG. 4 in that it includes an NPN bipolar transistor Tr2 and resistors R11 to R13 as the voltage adder/subtractor 13.

The collector of the bipolar transistor Tr2 is connected to the node N1, and the emitter of the bipolar transistor Tr2 is connected to the coil L2. The resistor R11 is placed between the base and the collector of the bipolar transistor Tr2. The resistor R12 is placed between the base and the emitter of the bipolar transistor Tr2. The resistor R13 is placed between the emitter of the bipolar transistor Tr2 and the power supply voltage terminal Vdd3.

When a collector-emitter voltage of the bipolar transistor Tr2 is Vtr2, the relationship of the bias voltages Vb1 and Vb2 is represented by Vb2=Vb1−Vtr2. When a base-emitter voltage of the bipolar transistor Tr2 is Vbe, $Vtr2 \approx (1+R11/R12) \cdot Vbe.$ (Fifth Specific Configuration Example of Doherty Amplification Circuit 1)

Figure 8:
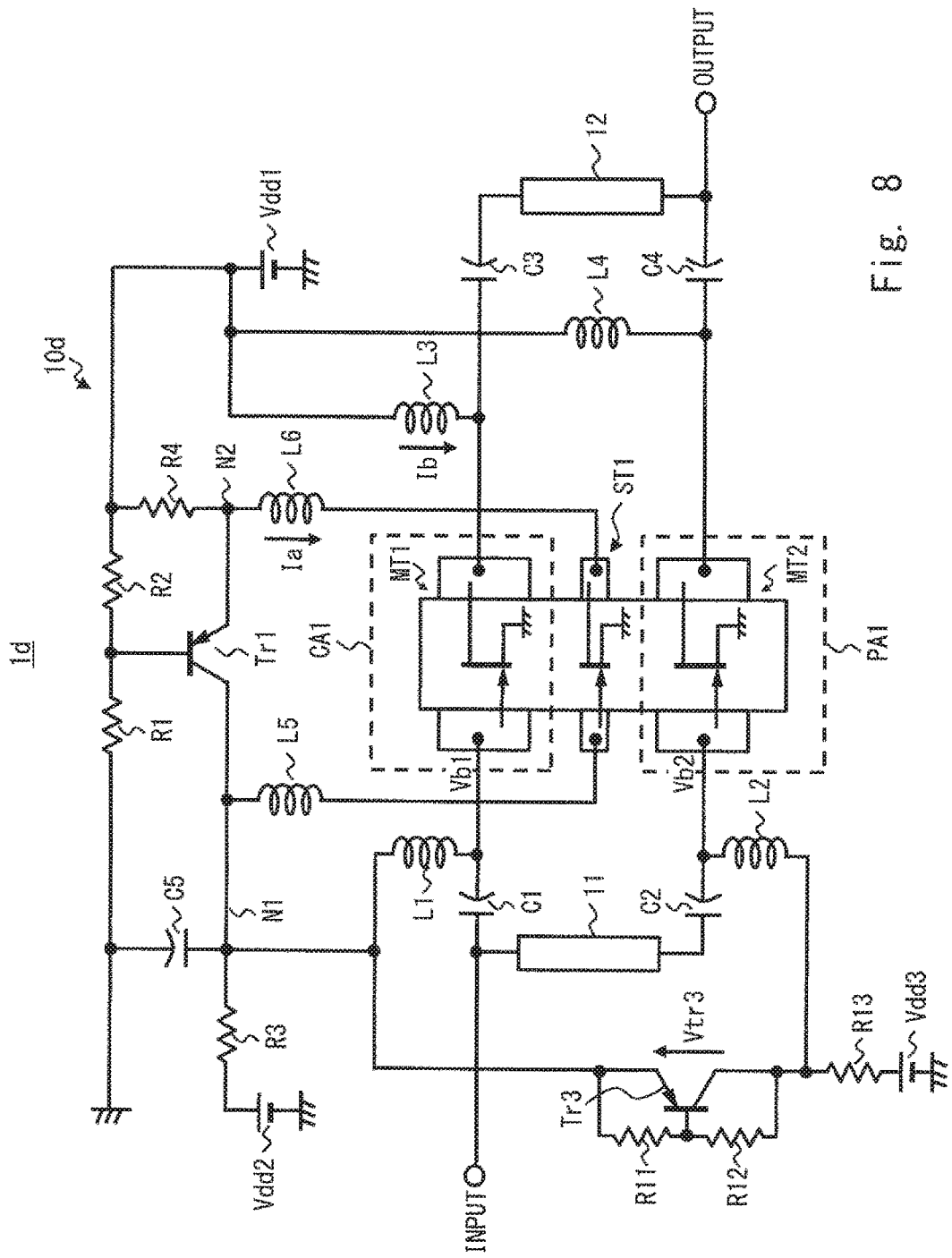
FIG. 8 is a view showing a fifth specific configuration example of the Doherty amplification circuit according to the second exemplary embodiment.

FIG. 8 is a view showing a fifth specific configuration example of the Doherty amplification circuit 1 as a Doherty amplification circuit 1d. The Doherty amplification circuit 1d shown in FIG. 8 is different from the Doherty amplification circuit 1 shown in FIG. 4 in that it includes a PNP bipolar transistor Tr3 and resistors R11 to R13 as the voltage adder/subtractor 13.

The emitter of the bipolar transistor Tr3 is connected to the node N1, and the collector of the bipolar transistor Tr3 is connected to the coil L2. The resistor R11 is placed between the base and the emitter of the bipolar transistor Tr3. The resistor R12 is placed between the base and the collector of the bipolar transistor Tr3. The resistor R13 is placed between the collector of the bipolar transistor Tr3 and the power supply voltage terminal Vdd3.

When a collector-emitter voltage of the bipolar transistor Tr3 is Vtr3, the relationship of the bias voltages Vb1 and Vb2 is represented by Vb2=Vb1−Vtr3. When a base-emitter voltage of the bipolar transistor Tr3 is Vbe, $Vtr3 \approx (1+R12/R11) \cdot Vbe.$ Because the specific configuration examples of the voltage adder/subtractor 13 shown in FIGS. 5 to 8 are simple, they can be integrated or put into the same packages together with all or some of the auto-biasing circuit 10, the main transistors MT1 and MT2 and the sub-transistor ST1. Note that a circuit that compensates for the temperature characteristics of diodes or the like may be further included.

<Third Exemplary Embodiment>

In this exemplary embodiment, an extended Doherty amplification circuit is described as another example of a Doherty amplification circuit to which the transistor package PKG1 shown in FIG. 1 is applied.

(First Configuration Example of Doherty Amplification Circuit 2)

Figure 9:
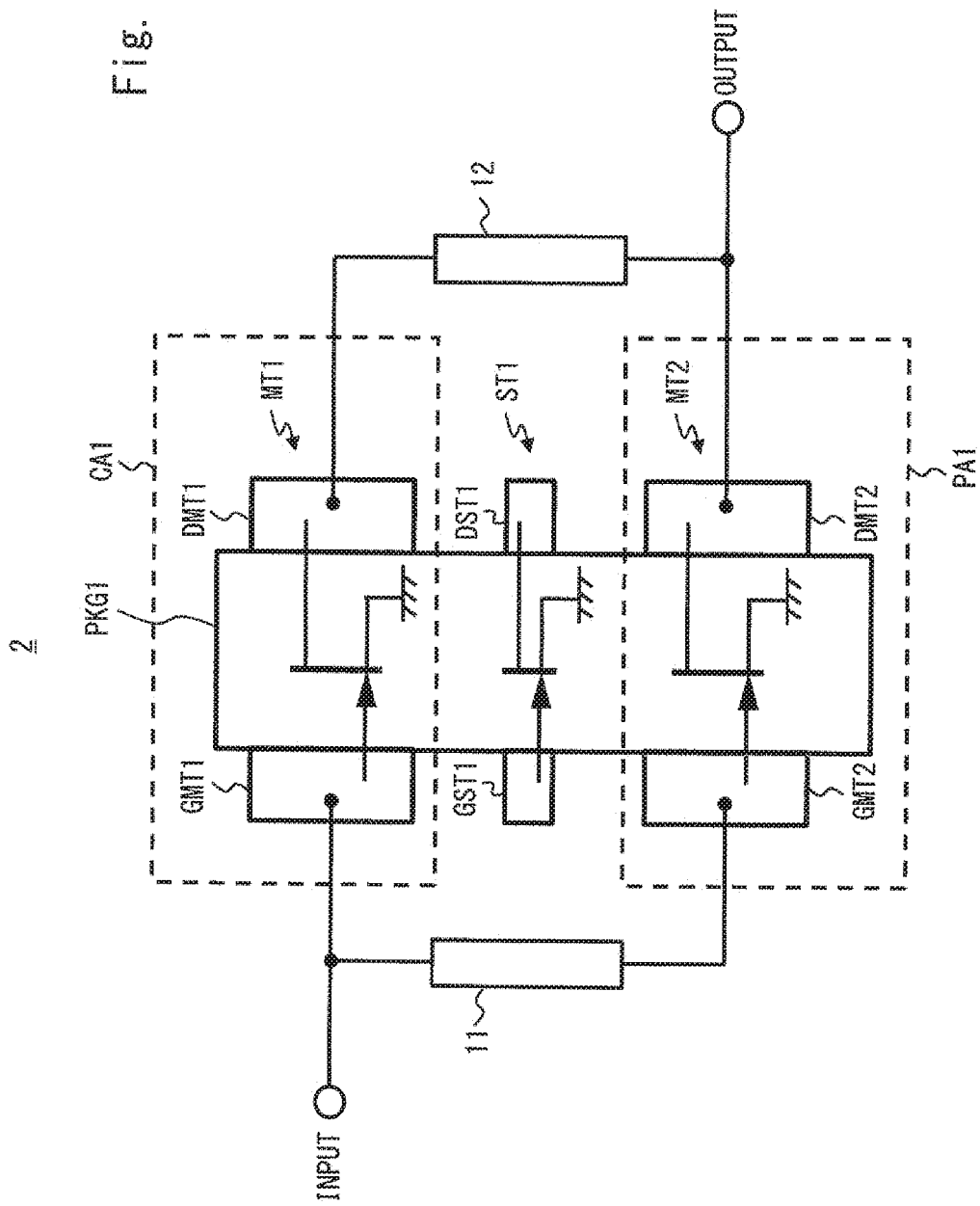
FIG. 9 is a view showing a first configuration example of a Doherty amplification circuit according to a third exemplary embodiment.

FIG. 9 is a view showing a first configuration example of a Doherty amplification circuit 2 according to a third exemplary embodiment. The Doherty amplification circuit 2 shown in FIG. 9 includes a carrier amplifier CA1, a peak amplifier PA1, a splitter 11 and a combiner 12. The basic operations and the connections of the respective elements are the same as those described above, and the redundant description is omitted.

In the example of FIG. 9, the carrier amplifier CA1 is formed by the transistor MT1, and the peak amplifier PA1 is formed by the transistor MT2. Thus, the carrier amplifier CA1 and the peak amplifier PA1 are formed by the transistors of the same size. Therefore, in the Doherty amplification circuit 2 shown in FIG. 9, power that is distributed to each of the carrier amplifier CA1 and the peak amplifier PA1 is the same.

(Second Configuration Example of Doherty Amplification Circuit 2)

Figure 10:
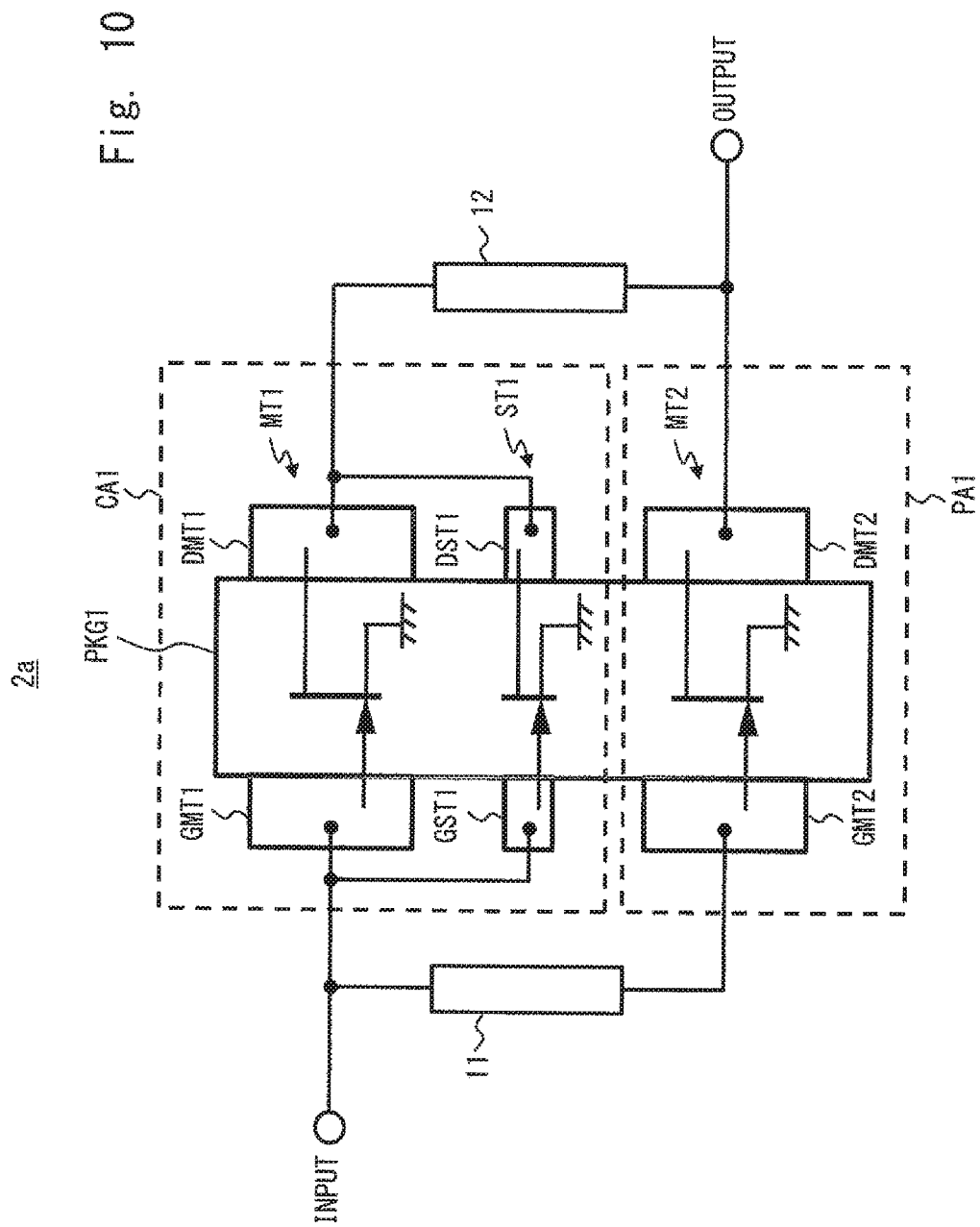
FIG. 10 is a view showing a second configuration example of the Doherty amplification circuit according to the third exemplary embodiment.

FIG. 10 is a view showing a second configuration example of the Doherty amplification circuit 2 according to the third exemplary embodiment as a Doherty amplification circuit 2a. The Doherty amplification circuit 2a shown in FIG. 10 is different from the Doherty amplification circuit 2 shown in FIG. 9 in the configuration of the carrier amplifier CA1.

To be specific, the carrier amplifier CA1 shown in FIG. 10 is formed by the main transistor MT1 and the sub-transistor ST1, and it amplifies a first split signal input to the gates of the transistors MT1 and ST1 and outputs it through the drains of the transistors MT1 and ST1. The other elements of the Doherty amplification circuit 2a shown in FIG. 10 are the same as those of the Doherty amplification circuit 2 shown in FIG. 9 and not redundantly described.

In the Doherty amplification circuit 2a shown in FIG. 10, power that is distributed to each of the carrier amplifier CA1 and the peak amplifier PA1 is different. Thus, the Doherty amplification circuit 2a shown in FIG. 10 forms a so-called extended Doherty amplification circuit.

(Third Configuration Example of Doherty Amplification Circuit 2)

Figure 11:
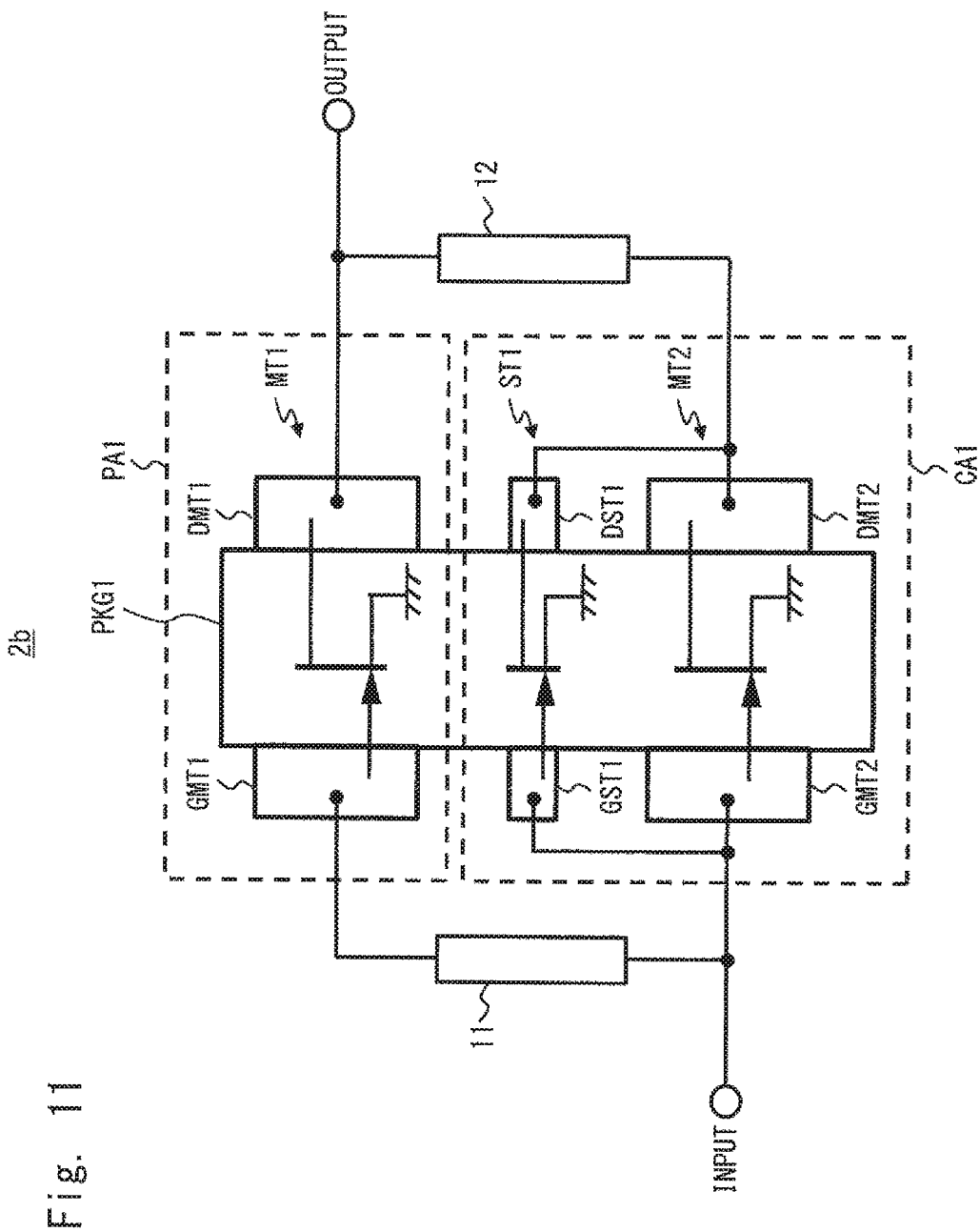
FIG. 11 is a view showing a third configuration example of the Doherty amplification circuit according to the third exemplary embodiment.

FIG. 11 is a view showing a third configuration example of the Doherty amplification circuit 2 according to the third exemplary embodiment as a Doherty amplification circuit 2b. The Doherty amplification circuit 2b shown in FIG. 11 is different from the Doherty amplification circuit 2a shown in FIG. 10 in that the positions of the carrier amplifier CA1 and the peak amplifier PA1 are interchanged.

To be specific, the carrier amplifier CA1 shown in FIG. 11 is formed by the main transistor MT2 and the sub-transistor ST1, and it amplifies a first split signal input to the gates of the transistors MT2 and ST1 and outputs it through the drains of the transistors MT2 and ST1. The peak amplifier PA1 shown in FIG. 11 is formed by the main transistor MT1, and it amplifies a second split signal input to the gate of the main transistor MT1 and outputs it through the drain of the main transistor MT1. The other elements of the Doherty amplification circuit 2b shown in FIG. 11 are the same as those of the Doherty amplification circuit 2 shown in FIG. 9 and not redundantly described.

In the Doherty amplification circuit 2b shown in FIG. 11, power is distributed to each of the carrier amplifier CA1 and the peak amplifier PA1 with the same ratio as in the Doherty amplification circuit 2a shown in FIG. 10. Thus, the Doherty amplification circuit 2b shown in FIG. 11 forms an extended Doherty amplification circuit which is the same as the Doherty amplification circuit 2a shown in FIG. 10 except that the positions of the carrier amplifier CA1 and the peak amplifier PA1 are interchanged.

(Fourth Configuration Example of Doherty Amplification Circuit 2)

Figure 12:
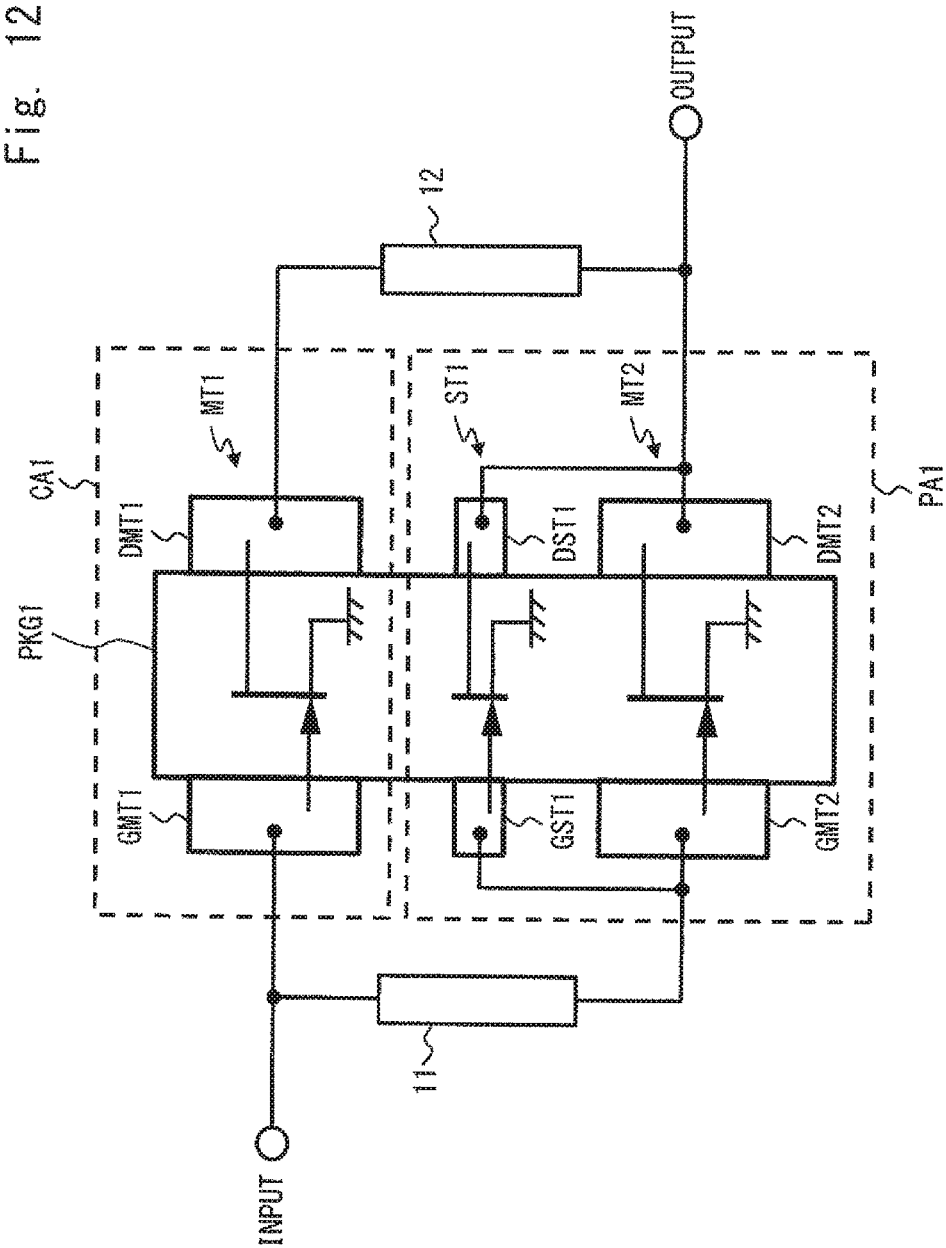
FIG. 12 is a view showing a fourth configuration example of the Doherty amplification circuit according to the third exemplary embodiment.

FIG. 12 is a view showing a fourth configuration example of the Doherty amplification circuit 2 according to the third exemplary embodiment as a Doherty amplification circuit 2c. The Doherty amplification circuit 2c shown in FIG. 12 is different from the Doherty amplification circuit 2 shown in FIG. 9 in the configuration of the peak amplifier PA1.

To be specific, the peak amplifier PA1 shown in FIG. 12 is formed by the main transistor MT2 and the sub-transistor ST1, and it amplifies a second split signal input to the gates of the transistors MT2 and ST1 and outputs it through the drains of the transistors MT2 and ST1. The other elements of the Doherty amplification circuit 2c shown in FIG. 12 are the same as those of the Doherty amplification circuit 2 shown in FIG. 9 and not redundantly described.

In the Doherty amplification circuit 2c shown in FIG. 12, power that is distributed to each of the carrier amplifier CA1 and the peak amplifier PA1 is different. Thus, the Doherty amplification circuit 2c shown in FIG. 12 forms a so-called extended Doherty amplification circuit.

(Fifth Configuration Example of Doherty Amplification Circuit 2)

Figure 13:
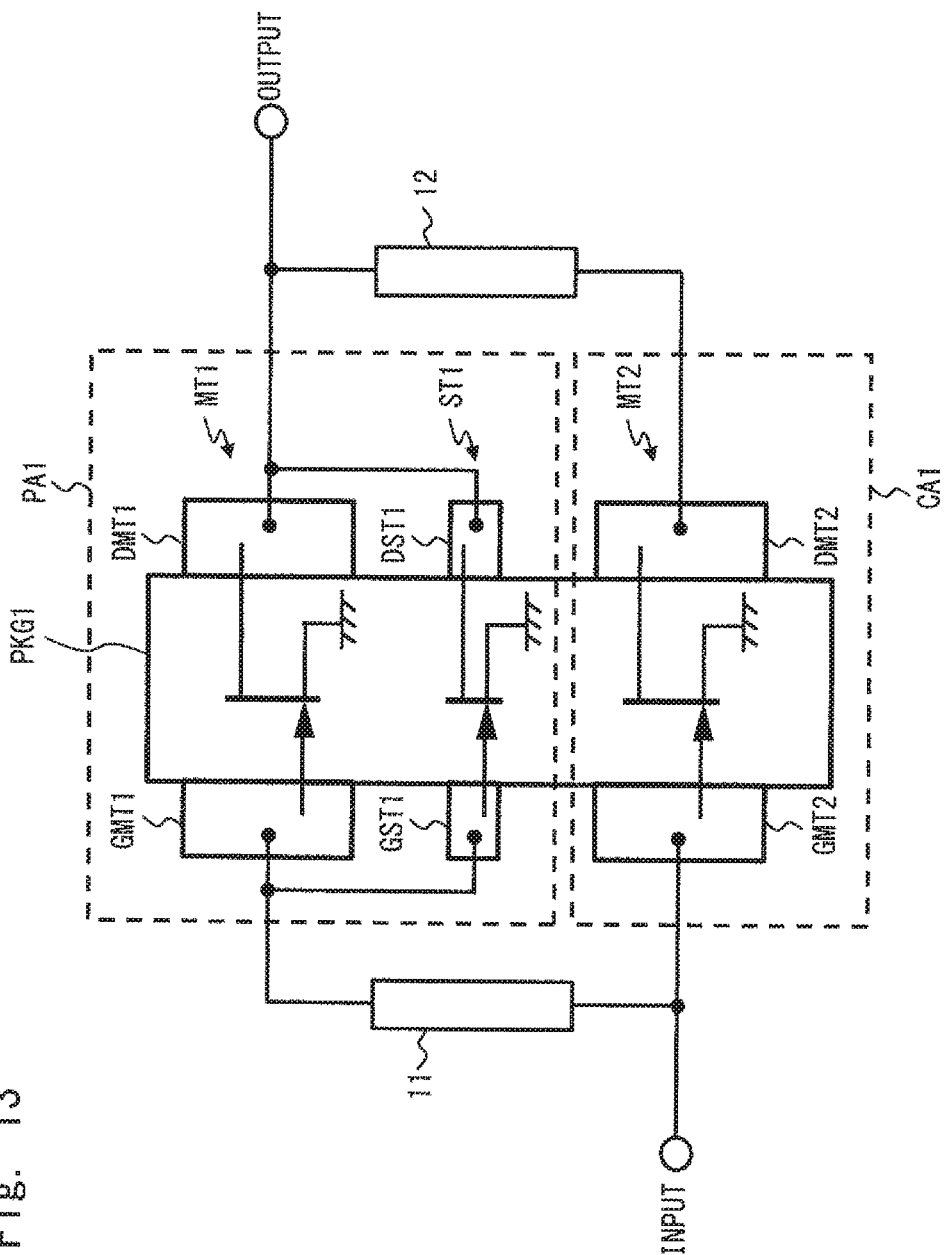
FIG. 13 is a view showing a fifth configuration example of the Doherty amplification circuit according to the third exemplary embodiment.

FIG. 13 is a view showing a fifth configuration example of the Doherty amplification circuit 2 according to the third exemplary embodiment as a Doherty amplification circuit 2d. The Doherty amplification circuit 2d shown in FIG. 13 is different from the Doherty amplification circuit 2c shown in FIG. 12 in that the positions of the carrier amplifier CA1 and the peak amplifier PA1 are interchanged.

To be specific, the carrier amplifier CA1 shown in FIG. 13 is formed by the main transistor MT2, and it amplifies a first split signal input to the gate of the main transistor MT2 and outputs it through the drain of the main transistor MT2. The peak amplifier PA1 shown in FIG. 13 is formed by the main transistor MT1 and the sub-transistor ST1, and it amplifies a second split signal input to the gates of the transistors MT1 and ST1 and outputs it through the drains of the transistors MT1 and ST1. The other elements of the Doherty amplification circuit 2d shown in FIG. 13 are the same as those of the Doherty amplification circuit 2 shown in FIG. 9 and not redundantly described.

In the Doherty amplification circuit 2d shown in FIG. 13, power is distributed to each of the carrier amplifier CA1 and the peak amplifier PA1 with the same ratio as in the Doherty amplification circuit 2c shown in FIG. 12. Thus, the Doherty amplification circuit 2d shown in FIG. 13 forms an extended Doherty amplification circuit which is the same as the Doherty amplification circuit 2c shown in FIG. 12 except that the positions of the carrier amplifier CA1 and the peak amplifier PA1 are interchanged.

Figure 14:
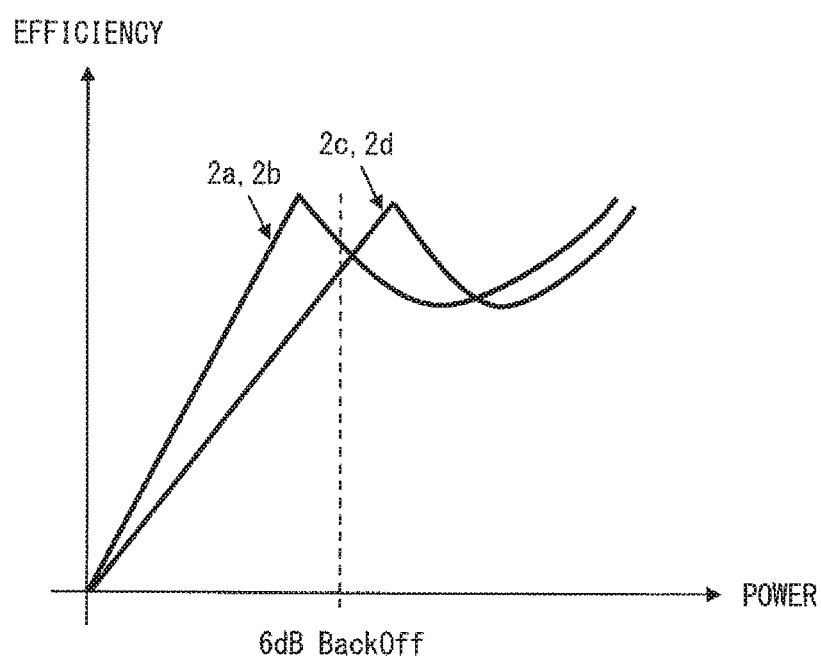
FIG. 14 is a view showing the relationship between the power and the power efficiency of the Doherty amplification circuits shown in FIGS. 10 to 13.

FIG. 14 is a view showing the relationship between the power and the power efficiency of the Doherty amplification circuits 2a to 2d shown in FIGS. 10 to 13. As shown in FIG. 14, the peak of the power efficiency with respect to the power is different between the Doherty amplification circuits 2a and 2b and the Doherty amplification circuits 2c and 2d where the power distribution ratio to the carrier amplifier CA1 and the peak amplifier PA1 is different. It is thus possible to form extended Doherty amplification circuits with various operating characteristics by using the transistor package PKG1.

As described above, it is possible to form an extended Doherty amplification circuit with desired operating characteristics and desired layout by using the transistor package PKG1. Because the transistor package PKG1 has the small size sub-transistor ST1, it is possible to achieve the extended Doherty amplification circuit with desired operating characteristics and desired layout in a small scale. Further, fine adjustment of the power distribution ratio is possible by increasing the number of sub-transistors ST1.

Further, because a transmission line length from the outputs of the carrier amplifier CA1 and the peak amplifier PA1 to a signal combining point is shortened, transmission loss is reduced. As a result, it is possible to enhance the power efficiency of the extended Doherty amplification circuit.

<Fourth Exemplary Embodiment>

Figure 15:
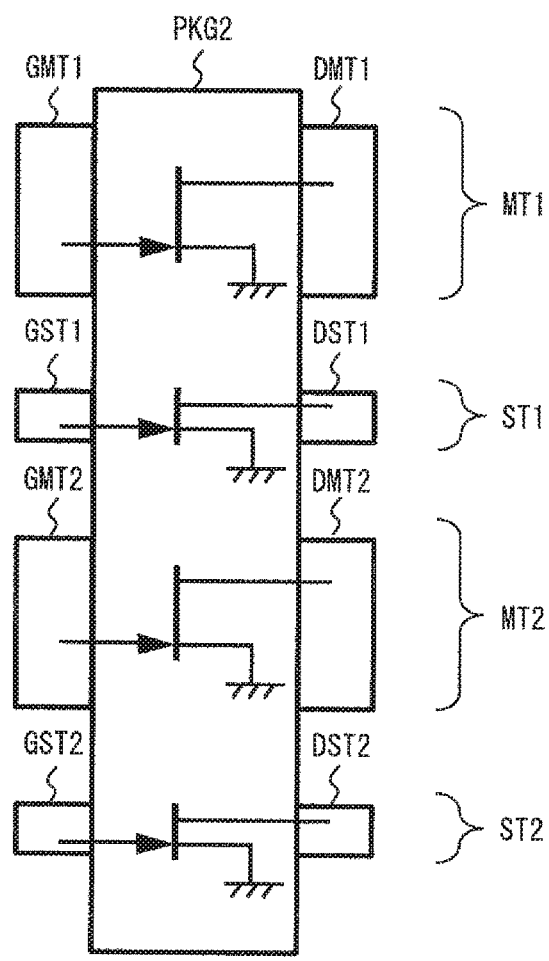
FIG. 15 is a plan view showing the overview of a transistor package PKG2 according to a fourth exemplary embodiment.

FIG. 15 is a plan view showing the overview of a transistor package PKG2 according to a fourth exemplary embodiment. The transistor package PKG2 shown in FIG. 15 is different from the transistor package PKG1 shown in FIG. 1 in that it further includes a sub-transistor (second sub-transistor) ST2 of the same configuration as the sub-transistor ST1. The other elements of the transistor package PKG2 shown in FIG. 15 are the same as those of the transistor package PKG1 shown in FIG. 1 and not redundantly described.

In the example of FIG. 15, the main transistor MT1, the sub-transistor ST1, the main transistor MT2 and the sub-transistor ST1 are arranged in this order in the plan view inside the package.

FIG. 16 is a view illustrating a Doherty amplification circuit to which the transistor package PKG2 shown in FIG. 15 is applied. FIG. 16 shows three application examples of the transistor package PKG2 shown in FIG. 15. In FIG. 16, "carrier" means that the transistor forms the carrier amplifier CA1, "peak" means that the transistor forms the peak amplifier PA1, "bias" means that the transistor forms the auto-biasing circuit 10, and "extended" means that the transistor and another main transistor form the carrier amplifier CA1 and the peak amplifier PA1. Note that the three application examples shown in FIG. 16 are no more than an example.

(Alternative Example of Transistor Package PKG2)

Figure 17:
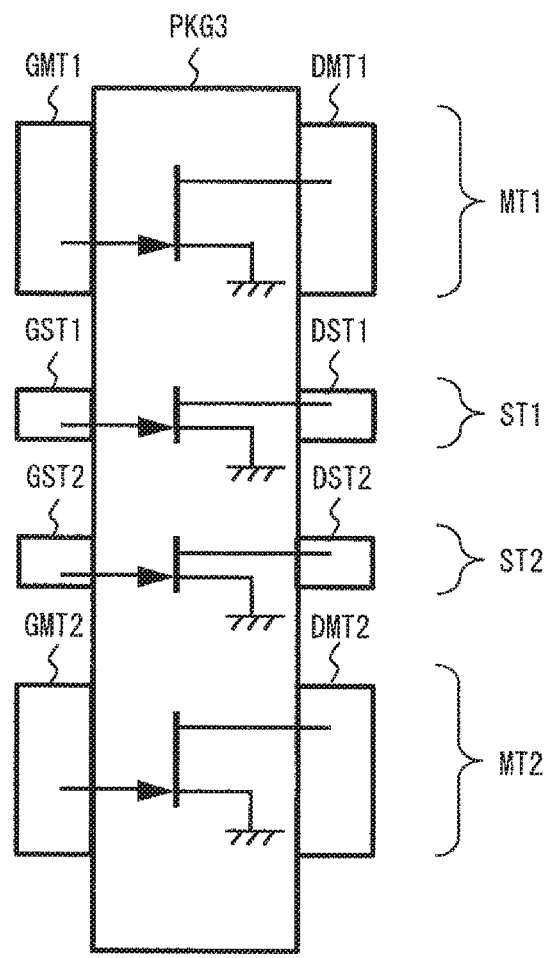
FIG. 17 is a plan view showing the overview of a transistor package PKG3 according to the fourth exemplary embodiment.

FIG. 17 is a plan view showing an alternative example of the transistor package PKG2 according to this exemplary embodiment as a transistor package PKG3. The transistor package PKG3 shown in FIG. 17 is different from the transistor package PKG2 shown in FIG. 15 in the positions of transistors.

In the example of FIG. 17, the main transistor MT1, the sub-transistor ST1, the sub-transistor ST1 and the main transistor MT2 are arranged in this order in the plan view inside the package.

FIG. 18 is a view illustrating a Doherty amplification circuit to which the transistor package PKG3 shown in FIG. 17 is applied. FIG. 18 shows four application examples of the transistor package PKG3 shown in FIG. 17.

As described above, because the transistor packages PKG2 and PKG3 include two sub-transistors ST1 and ST2, it is possible to form a larger variety of types of Doherty amplification circuits such as a Doherty amplification circuit with auto-biasing function and an extended Doherty amplification circuit. Because the transistor packages PKG2 and PKG3 have the small-size sub-transistors ST1 and ST2, it is possible to achieve various types of Doherty amplification circuits in a small scale.

Note that the number of sub-transistors included in the transistor package PKG2 may be three or more. Likewise, the number of main transistors included in the transistor package PKG2 may be three or more.

As described above, the transistor packages PKG1 to PKG3 according to the above-described exemplary embodiments are capable of forming various types of Doherty amplification circuits such as a Doherty amplification circuit with auto-biasing function and an extended Doherty amplification circuit with desired operating characteristics. Because various types of Doherty amplification circuits can be formed by a common transistor package, it is possible to reduce design man-hours and management and adjustment man-hours when designing and manufacturing various types of Doherty amplification circuits. Because the transistor packages PKG1 to PKG2 have the small-size sub-transistor, it is possible to achieve various types of Doherty amplification circuits in a small scale.

Although the case where the main transistors MT1 and MT2 and the sub-transistors ST1 and ST2 are field effect transistors is described as an example in above-described exemplary embodiments, it is not limited thereto. The main transistors MT1 and MT2 and the sub-transistors ST1 and ST2 may be bipolar transistors. Note that, while the size of the field effect transistor is represented typically by a gate width, the size of the bipolar transistor is represented by an emitter area. Further, while the field effect transistor is a voltage control element, the bipolar transistor is a current control element, and therefore when the bipolar transistor is used, a bias or the like is applied by a current. The present invention is implemented by making such changes and modifications that should be easy to those skilled in the art as a matter of course.

Further, in the transistor packages PKG1 to PKG3, the size of the sub-transistors ST1 and ST2 may be equal to the size of the main transistors MT1 and MT2, though this is not necessarily preferable.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2014-17171, filed on Jan. 31, 2014, the disclosure of which is incorporated herein in its entirety by reference.

REFERENCE SIGNS LIST

1 DOHERTY AMPLIFICATION CIRCUIT
1a~1d DOHERTY AMPLIFICATION CIRCUIT
2 DOHERTY AMPLIFICATION CIRCUIT
2a~2d DOHERTY AMPLIFICATION CIRCUIT
10 AUTO-BIASING CIRCUIT
10a~10d AUTO-BIASING CIRCUIT
11 SPLITTER
12 COMBINER
13 VOLTAGE ADDER/SUBTRACTOR
13a~13d VOLTAGE ADDER/SUBTRACTOR
C1~C5 CAPACITOR
CA1 CARRIER AMPLIFIER
D1~DN DIODE
DMT1 DRAIN ELECTRODE
DMT2 DRAIN ELECTRODE
DST1 DRAIN ELECTRODE
DST2 DRAIN ELECTRODE
GMT1 GATE ELECTRODE
GMT2 GATE ELECTRODE
GST1 GATE ELECTRODE
GST2 GATE ELECTRODE
L1~L6 COIL
MT1,MT2 MAIN TRANSISTOR
PA1 PEAK AMPLIFIER
PKG1~PKG3 TRANSISTOR PACKAGE
R1~R4 RESISTOR
R11~R13 RESISTOR
ST1,ST2 SUB-TRANSISTOR
Tr1~Tr3 BIPOLAR TRANSISTOR
ZD1 ZENER DIODE

The invention claimed is:

1. An amplification circuit including a transistor package, the amplification circuit comprising:
   first and second main transistors;
   a first sub-transistor placed in the same package as the first and second main transistors and having a smaller size than the first and second main transistors;
   a splitter that splits an input signal and generates first and second split signals;
   a first amplifier that is formed at least by the first main transistor and linearly amplifies the first split signal;
   a second amplifier that is formed at least by the second main transistor and non-linearly amplifies the second split signal; and
   a combiner that combines output signals of the first and second amplifiers;
   wherein:
   the first main transistor, the second main transistor and the first sub-transistor are field effect transistors, and
   the amplification circuit further includes an auto-biasing circuit that sets an operating point of the first amplifier by detecting a gate voltage of the first sub-transistor that maintains a drain current of the first sub-transistor at a specified value and supplying a first bias voltage corresponding to the detected gate voltage to a gate of the first main transistor.

2. The amplification circuit according to claim 1, wherein the auto-biasing circuit further sets an operating point of the second amplifier by supplying a second bias voltage corresponding to the detected gate voltage to a gate of the second main transistor.

3. The amplification circuit according to claim 1, wherein characteristics per unit size of the first main transistor, the second main transistor and the first subtransistor are substantially the same.

4. An amplification circuit including a transistor package, the amplification circuit comprising:
   first and second main transistors;
   a first sub-transistor placed in the same package as the first and second main transistors and having a smaller size than the first and second main transistors;
   a splitter that splits an input signal and generates first and second split signals;
   a first amplifier that is formed at least by the first main transistor and linearly amplifies the first split signal;
   a second amplifier that is formed at least by the second main transistor and non-linearly amplifies the second split signal; and
   a combiner that combines output signals of the first and second amplifiers;
   wherein:
   the first main transistor, the second main transistor and the first sub-transistor are bipolar transistors, and
   the amplification circuit further includes an auto-biasing circuit that sets an operating point of the first amplifier by detecting a base current of the first sub-transistor that maintains a collector current of the first sub-transistor at a specified value and supplying a first bias current corresponding to the detected base current to a base of the first main transistor.

5. The amplification circuit according to claim 4, wherein the auto-biasing circuit further sets an operating point of the second amplifier by supplying a second bias current corresponding to the detected base current to a base of the second main transistor.

6. The amplification circuit according to claim 4, wherein characteristics per unit size of the first main transistor, the second main transistor and the first sub-transistor are substantially the same.

7. An amplification circuit including a transistor package, the amplification circuit comprising:
   first and second main transistors;
   a first sub transistor placed in the same package as the first and second main transistors and having a smaller size than the first and second main transistors;
   a second sub transistor having a smaller size than the first and second main transistors;
   a splitter that splits an input signal and generates first and second split signals;
   a first amplifier that is formed at least by the first main transistor and non-linearly amplifies the second split signal; and
   a combiner that combines output signals of the first and second amplifiers
   wherein
   the first main transistor, the second main transistor, the first sub-transistor and the second sub-transistor are field effect transistors, and
   the amplification circuit further includes an auto-biasing circuit that sets an operating point of the first amplifier by detecting a gate voltage of the second sub-transistor that maintains a drain current of the second sub-transistor at a specified value and supplying a first bias voltage corresponding to the detected gate voltage to a gate of the first main transistor, and sets an operating point of the second amplifier by supplying a second bias voltage corresponding to the detected gate voltage to a gate of the second main transistor.

8. The amplification circuit according to claim 7, wherein the first sub-transistor and one of the first and second main transistors form one of the first and second amplifiers.

9. The amplification circuit according to claim 7, wherein characteristics per unit size of the first main transistor, the second main transistor, the first sub- transistor and the second sub-transistor are substantially the same.

* * * * *